(12) United States Patent
Farnworth et al.

(10) Patent No.: US 7,199,439 B2
(45) Date of Patent: Apr. 3, 2007

(54) MICROELECTRONIC IMAGERS AND METHODS OF PACKAGING MICROELECTRONIC IMAGERS

(75) Inventors: Warren M. Farnworth, Nampa, ID (US); Sidney B. Rigg, Meridian, ID (US); William M. Hiatt, Eagle, ID (US); Kyle K. Kirby, Boise, ID (US); Peter A. Benson, Boise, ID (US); James M. Wark, Boise, ID (US); Alan G. Wood, Boise, ID (US); David R. Hembree, Boise, ID (US); Salman Akram, Boise, ID (US); Charles M. Watkins, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/867,352

(22) Filed: Jun. 14, 2004

(65) Prior Publication Data

US 2005/0275048 A1   Dec. 15, 2005

(51) Int. Cl.
*H01L 31/0203* (2006.01)
(52) U.S. Cl. ..................... 257/433; 257/222
(58) Field of Classification Search ............... 257/59, 257/72, 222, 225, 232, 234, 433, 81, 99, 257/431, 432
See application file for complete search history.

(56) References Cited

U.S. PATENT DOCUMENTS

| | | | |
|---|---|---|---|
| 3,345,134 A | 10/1967 | Heymer et al. | |
| 4,534,100 A | 8/1985 | Lane | |
| 4,906,314 A | 3/1990 | Farnworth et al. | |
| 5,130,783 A | 7/1992 | McLellan | |
| 5,371,397 A | 12/1994 | Maegawa et al. | |
| 5,424,573 A | 6/1995 | Kato et al. | |
| 5,435,887 A | 7/1995 | Rothschild et al. | |
| 5,505,804 A | 4/1996 | Mizuguchi et al. | |
| 5,560,047 A | 10/1996 | Shimada | |
| 5,593,913 A | 1/1997 | Aoki | |
| 5,605,783 A | 2/1997 | Revelli et al. | |

(Continued)

FOREIGN PATENT DOCUMENTS

EP      0 886 323      12/1998

(Continued)

OTHER PUBLICATIONS

U.S. Appl. No. 10/785,466, Kirby.

(Continued)

*Primary Examiner*—S. V. Clark
(74) *Attorney, Agent, or Firm*—Dickstein Shapiro LLP (57) ABSTRACT

Microelectronic imagers and methods for packaging microelectronic imagers are disclosed herein. In one embodiment, a microelectronic imaging unit can include a microelectronic die, an image sensor, an integrated circuit electrically coupled to the image sensor, and a bond-pad electrically coupled to the integrated circuit. An electrically conductive through-wafer interconnect extends through the die and is in contact with the bond-pad. The interconnect can include a passage extending completely through the substrate and the bond-pad with conductive fill material at least partially disposed in the passage. An electrically conductive support member is carried by and projects from the bond-pad. A cover over the image sensor is coupled to the support member.

31 Claims, 7 Drawing Sheets

U.S. PATENT DOCUMENTS

| | | | |
|---|---|---|---|
| 5,672,519 A | 9/1997 | Song et al. | |
| 5,694,246 A | 12/1997 | Aoyama et al. | |
| 5,708,293 A | 1/1998 | Ochi et al. | |
| 5,771,158 A | 6/1998 | Yamagishi et al. | |
| 5,776,824 A | 7/1998 | Farnworth et al. | |
| 5,811,799 A | 9/1998 | Wu | |
| 5,821,532 A | 10/1998 | Beaman et al. | |
| 5,857,963 A | 1/1999 | Pelchy et al. | |
| 5,861,654 A | 1/1999 | Johnson | |
| 5,877,040 A | 3/1999 | Park et al. | |
| 5,897,338 A | 4/1999 | Kaldenberg | |
| 5,914,488 A | 6/1999 | Sone | |
| 5,977,535 A | 11/1999 | Rostoker | |
| 5,998,862 A | 12/1999 | Yamanaka | |
| 6,080,291 A | 6/2000 | Woodruff et al. | |
| 6,104,086 A | 8/2000 | Ichikawa et al. | |
| 6,114,240 A | 9/2000 | Akram et al. | |
| 6,143,588 A | 11/2000 | Glenn | |
| 6,236,046 B1 | 5/2001 | Watabe et al. | |
| 6,259,083 B1 | 7/2001 | Kimura | |
| 6,266,197 B1 | 7/2001 | Glenn et al. | |
| 6,274,927 B1 | 8/2001 | Glenn | |
| 6,285,064 B1 | 9/2001 | Foster | |
| 6,351,027 B1 | 2/2002 | Giboney et al. | |
| 6,372,548 B2 | 4/2002 | Bessho et al. | |
| 6,407,381 B1 | 6/2002 | Glenn et al. | |
| 6,411,439 B2 | 6/2002 | Nishikawa | |
| 6,483,652 B2 | 11/2002 | Nakamura | |
| 6,503,780 B1 | 1/2003 | Glenn et al. | |
| 6,541,762 B2 | 4/2003 | Kang et al. | |
| 6,566,745 B1 | 5/2003 | Beyne et al. | |
| 6,603,183 B1 | 8/2003 | Hoffman | |
| 6,617,623 B2 | 9/2003 | Rhodes | |
| 6,661,047 B2 | 12/2003 | Rhodes | |
| 6,667,551 B2 | 12/2003 | Hanaoka et al. | |
| 6,670,986 B1 | 12/2003 | Ben Shoshan et al. | |
| 6,686,588 B1 | 2/2004 | Webster et al. | |
| 6,703,310 B2 | 3/2004 | Mashino et al. | |
| 6,734,419 B1 | 5/2004 | Glenn et al. | |
| 6,759,266 B1 | 7/2004 | Hoffman | |
| 6,774,486 B2 | 8/2004 | Kinsman | |
| 6,778,046 B2 | 8/2004 | Stafford et al. | |
| 6,791,076 B2 | 9/2004 | Webster | |
| 6,795,120 B2 | 9/2004 | Takagi et al. | |
| 6,797,616 B2 | 9/2004 | Kinsman | |
| 6,800,943 B2 | 10/2004 | Adachi | |
| 6,813,154 B2 | 11/2004 | Diaz et al. | |
| 6,825,458 B1 | 11/2004 | Moess et al. | |
| 6,828,663 B2 | 12/2004 | Chen et al. | |
| 6,828,674 B2 | 12/2004 | Karpman | |
| 6,844,978 B2 | 1/2005 | Harden et al. | |
| 6,849,916 B1* | 2/2005 | Glenn et al. | 257/434 |
| 6,864,172 B2* | 3/2005 | Noma et al. | 438/674 |
| 6,882,021 B2 | 4/2005 | Boon et al. | |
| 6,885,107 B2 | 4/2005 | Kinsman | |
| 6,934,065 B2 | 8/2005 | Kinsman | |
| 6,946,325 B2 | 9/2005 | Yean et al. | |
| 2002/0006687 A1 | 1/2002 | Lam | |
| 2002/0057468 A1 | 5/2002 | Segawa et al. | |
| 2002/0089025 A1 | 7/2002 | Chou | |
| 2002/0096729 A1 | 7/2002 | Tu et al. | |
| 2002/0113296 A1 | 8/2002 | Cho et al. | |
| 2002/0145676 A1 | 10/2002 | Kuno et al. | |
| 2003/0062601 A1 | 4/2003 | Hamden et al. | |
| 2004/0012698 A1 | 1/2004 | Suda et al. | |
| 2004/0023469 A1 | 2/2004 | Suda | |
| 2004/0038442 A1 | 2/2004 | Kinsman | |
| 2004/0041261 A1 | 3/2004 | Kinsman | |
| 2004/0082094 A1 | 4/2004 | Yamamoto | |
| 2004/0214373 A1 | 10/2004 | Jiang et al. | |
| 2004/0245649 A1* | 12/2004 | Imaoka | 257/774 |
| 2005/0052751 A1 | 3/2005 | Liu et al. | |
| 2005/0104228 A1 | 5/2005 | Rigg et al. | |
| 2005/0110889 A1* | 5/2005 | Tuttle et al. | 348/340 |
| 2005/0127478 A1 | 6/2005 | Hiatt et al. | |
| 2005/0151228 A1* | 7/2005 | Tanida et al. | 257/620 |
| 2005/0236708 A1 | 10/2005 | Farnworth et al. | |
| 2005/0254133 A1 | 11/2005 | Akram et al. | |
| 2006/0152615 A1* | 7/2006 | Kwon et al. | 348/340 |

FOREIGN PATENT DOCUMENTS

| | | |
|---|---|---|
| EP | 1 157 967 A2 | 11/2001 |
| FR | 2 835 654 A1 | 8/2003 |
| JP | 59-101882 A | 6/1984 |
| JP | 59-191388 | 10/1984 |
| JP | 07-263607 A | 10/1995 |
| JP | 2001-077496 A | 3/2001 |
| WO | WO-90/05424 A1 | 5/1990 |
| WO | WO-02/075815 A1 | 9/2002 |
| WO | WO-02/095796 A2 | 11/2002 |
| WO | WO-2004/054001 A2 | 6/2004 |

OTHER PUBLICATIONS

U.S. Appl. No. 10/845,304, Jiang et al.
U.S. Appl. No. 10/857,948, Boettiger et al.
U.S. Appl. No. 10/863,994, Akram et al.
U.S. Appl. No. 10/864,974, Kirby et al.
U.S. Appl. No. 10/867,505, Farnworth et al.
U.S. Appl. No. 10/879,398, Akram et al.
U.S. Appl. No. 10/879,838, Kirby et al.
U.S. Appl. No. 10/893,022, Hall et al.
U.S. Appl. No. 10/894,262, Farnworth et al.
U.S. Appl. No. 10/901,851, Derderian et al.
U.S. Appl. No. 10/910,491, Bolken et al.
U.S. Appl. No. 10/915,180, Street et al.
U.S. Appl. No. 10/919,604, Farnworth et al.
U.S. Appl. No. 10/922,177, Oliver et al.
U.S. Appl. No. 10/922,192, Farnworth.
U.S. Appl. No. 10/925,406, Oliver.
U.S. Appl. No. 10/925,501, Oliver.
U.S. Appl. No. 10/925,502, Watkins et al.
U.S. Appl. No. 10/927,550, Derderian et al.
U.S. Appl. No. 10/927,760, Chong et al.
U.S. Appl. No. 10/928,598, Kirby.
U.S. Appl. No. 10/932,296, Oliver et al.
U.S. Appl. No. 11/027,443, Kirby.
U.S. Appl. No. 11/054,692, Boemler.
U.S. Appl. No. 11/056,211, Hembree et al.
U.S. Appl. No. 11/056,484, Boettiger et al.
U.S. Appl. No. 11/061,034, Boettiger.
U.S. Appl. No. 11/146,783, Tuttle et al.
U.S. Appl. No. 11/169,546, Sulfridge.
U.S. Appl. No. 11/169,838, Sulfridge.
U.S. Appl. No. 11/177,905, Akram.
U.S. Appl. No. 11/209,524, Akram.
U.S. Appl. No. 11/217,169, Hiatt et al.
U.S. Appl. No. 11/217,877, Oliver et al.
U.S. Appl. No. 11/218,126, Farnworth et al.
U.S. Appl. No. 11/218,243, Kirby et al.
Aachboun, S. and P. Ranson, "Cryogenic etching of deep narrow trenches in silicon," J. Vac. Sci. Technol. A 18(4), Jul./Aug. 2000, pp. 1848-1852.
Aachboun, S. and P. Ranson, "Deep anisotropic etching of silicon," J. Vac. Sci. Technol. A 17(4), Jul./Aug. 1999, pp. 2270-2273.
Austin, M.D. and S.Y. Chou, "Fabrication of 70 nm channel length polymer organic thin-film transistors using nanoimprint lithography," Applied Physics Letters, vol. 81, No. 23, pp. 4431-4433, Dec. 2, 2002, American Institute of Physics.
Blackburn, J.M. et al., "Deposition of Conformal Copper and Nickel Films from Supercritical Carbon Dioxide," Science, vol. 294, pp. 141-145, Oct. 5, 2001.

Brubaker, C. et al., "Ultra-thick Lithography for Advanced Packaging and MEMS," SPIE's 27th Annual International Symposium on Microlithography 2002, Mar. 3-8, 2002, Santa Clara, CA.

Cheng, Yu-T. et al., "Vacuum Packaging Technology Using Localized Aluminum/Silicon-to-Glass Bonding." Journal of Microelectromechanical Systems, vol. 11, No. 5, pp. 556-565, Oct. 2002.

DuPont Electronic Materials, Data Sheet, Pyralux PC 2000 Flexible Composites, 4 pages, Oct. 1998, <http://www.dupont.com/fcm>.

Edmund Industrial Optics, Mounted IR Filters, 1 page, retrieved from the Internet on Jun. 30, 2003, <http://www.edmundoptics.com>.

Hamdorf, M. et al., "Surface-rheological measurements on glass forming polymers based on the surface tension driven decay of imprinted corrugation gratings," Journal of Chemical Physics, vol. 112, No. 9, pp. 4262-4270, Mar. 1, 2000, American Institute of Physics.

Hirafune, S. et al., "Packaging Technology for Imager Using Through-hole Interconnection in Si Substrate," Proceeding of HDP'04, IEEE, pp. 303-306, Jul. 2004.

IBM, Zurich Research Laboratory, EPON SU-8 photoresist, 1 page, retrieved from the Internet on Jan. 21, 2003, <http://www.zurich.ibm.com/st/mems/su8.html>.

Intrinsic Viscosity and Its Relation to Intrinsic Conductivity, 9 pages, retrieved from the Internet on Oct. 30, 2003, <http://www.ciks.cbt.nist.gov/~garbocz/paper58/node3.html>.

King, B. et al., Optomec, Inc., M3D™ Technology, Maskless Mesoscale™ Materials Deposition, 5 pages, <http://www.optomec.com/downloads/M3D%20White%Paper%20080502.pdf>, retrieved from the Internet on Jun. 17, 2005.

Kingpak Technology, Inc. "CMOS Image Sensor Packaging," 1 page, retrieved from the Internet on Aug. 26, 2003, <http://www.kingpak.com/CMOSImager.html>.

Kramer, S.J. et al., "Annual Report—Applications of Supercritical Fluid Technology to Semiconductor Device Processing," pp. 1-29, Nov. 2001.

Kyocera Corporation, Memory Package, 1 page, retrieved from the Internet on Dec. 3, 2004, <http://global.kyocera.com/prdct/semicon/ic_pkg/memory_p.html>.

Lin, Tim (Zhigang) and Rick Yoon, "One Package Technique of Exposed MEMS Sensors," pp. 105-108, 2002 International Symposium on Microelectronics, Sep. 2002.

Ma, X. et al., "Low Temperature Bonding for Wafer Scale Packaging and Assembly of Micromachined Sensors," Final Report 1998-1999 for MICRO Project 98-144, 3 pages. Department of Electrical & Computer Engineering, University of California, Davis.

Micro Chem, Nano SU-8, Negative Tone Photoresist Formulations 50-100, 4 pages, Feb. 2002, <http://www.microchem.com/products/pdf/SU8_50-100.pdf>.

Optomec, Inc., M3D™ Technology, Maskless Mesoscale Materials Deposition (M3D), 1 page, <http://www.optomec.com/html/m3d.htm>, retrieved from the Internet on Aug. 15, 2003.

Optomec, Inc., M3D™, Maskless Mesoscale™ Materials Deposition, 2 pages. <http://www.optomec.com/downloads/M3DSheet.pdf>, retrieved from the Internet on Jun. 17, 2005.

Photo Vision Systems, Inc., "Advances in Digital Image Sensors," 22 pages, First Annual New York State Conference on Microelectronic Design, Jan. 12, 2002.

Shen, X.-J. et al., "Microplastic embossing process: experimental and theoretical characterizations," Sensors and Actuators, A 97-98 (2002) pp. 428-433, Elsevier Science B.V.

Tapes II International Tape and Fabrication Company, Electronics and Electrical Tapes, 2 pages, 2003, <http://www.tapes2.com/electronics.htm>.

TransChip, 1 page, retrieved from the Internet on Aug. 26, 2003, <http://www.missionventures.com/portfolio/companies/transchip.html>.

TransChip, Inc., CMOS vs CCD, 3 pages, retrieved from the Internet on Dec. 14, 2005, <http://www.transchip.com/content.aspx?id=127>.

TransChip, Inc., Technology, 3 pages, retrieved from the Internet on Dec. 14, 2005, <http://www.transchip.com/content.aspx?id=10>.

UCI Integrated Nanosystems Research Facility, "Cleaning procedures for glass substrates," 3 pages, Fall 1999..

UCI Integrated Nanosystems Research Facility, "Glass Etch Wet Process," 3 pages, Summer 2000.

Walker, M.J., "Comparison of Bosch and cryogenic processes for patterning high aspect ratio features in silicon," 11 pages, Proc. SPIE vol. 4407, p. 89-99, MEMS Design, Fabrication, Characterization, and Packaging, Uwe F. Behringer; Deepak G. Uttamchandani; Eds., Apr. 2001.

Xsil, Via Applications, 1 page, <http://www.xsil.com/viaapplications/index.htm>, retrieved from the Internet on Jul. 22, 2003.

Xsil, Vias for 3D Packaging, 1 page, <http://www.xsil.com/viaapplications/3dpackaging/index.htm>, retrieved from the Internet on Jul. 22, 2003.

Ye, X.R. et al., "Immersion Deposition of Metal Films on Silicon and Germanium Substrates in Supercritical Carbon Dioxide," Chem. Mater. 2003, 15, 83-91.

Yoshida, J. "TransChip rolls out a single-chip CMOS imager," 3 pages, EE Times, Jul. 18, 2003.

* cited by examiner

MICROELECTRONIC IMAGERS AND METHODS OF PACKAGING MICROELECTRONIC IMAGERS

TECHNICAL FIELD

The present invention is related to microelectronic imagers and methods for packaging microelectronic imagers. Several aspects of the present invention are directed toward microelectronic imagers that are responsive to radiation in the visible light spectrum or radiation in other spectrums.

BACKGROUND

Microelectronic imagers are used in digital cameras, wireless devices with picture capabilities, and many other applications. Cell phones and Personal Digital Assistants (PDAs), for example, incorporate microelectronic imagers for capturing and sending pictures. The use of microelectronic imagers in electronic devices has been steadily increasing as imagers become smaller and produce higher quality images with increased pixel counts.

Microelectronic imagers include image sensors that use Charged Coupled Device (CCD) systems, Complementary Metal-Oxide Semiconductor (CMOS) systems, or other systems. CCD image sensors have been widely used in digital cameras and other applications. CMOS image sensors are also becoming very popular because they have low production costs, high yields, and small sizes. CMOS image sensors provide these advantages because they are manufactured using technology and equipment developed for fabricating semiconductor devices. CMOS image sensors, as well as CCD image sensors, are accordingly "packaged" to protect their delicate components and provide external electrical contacts.

Figure 1:
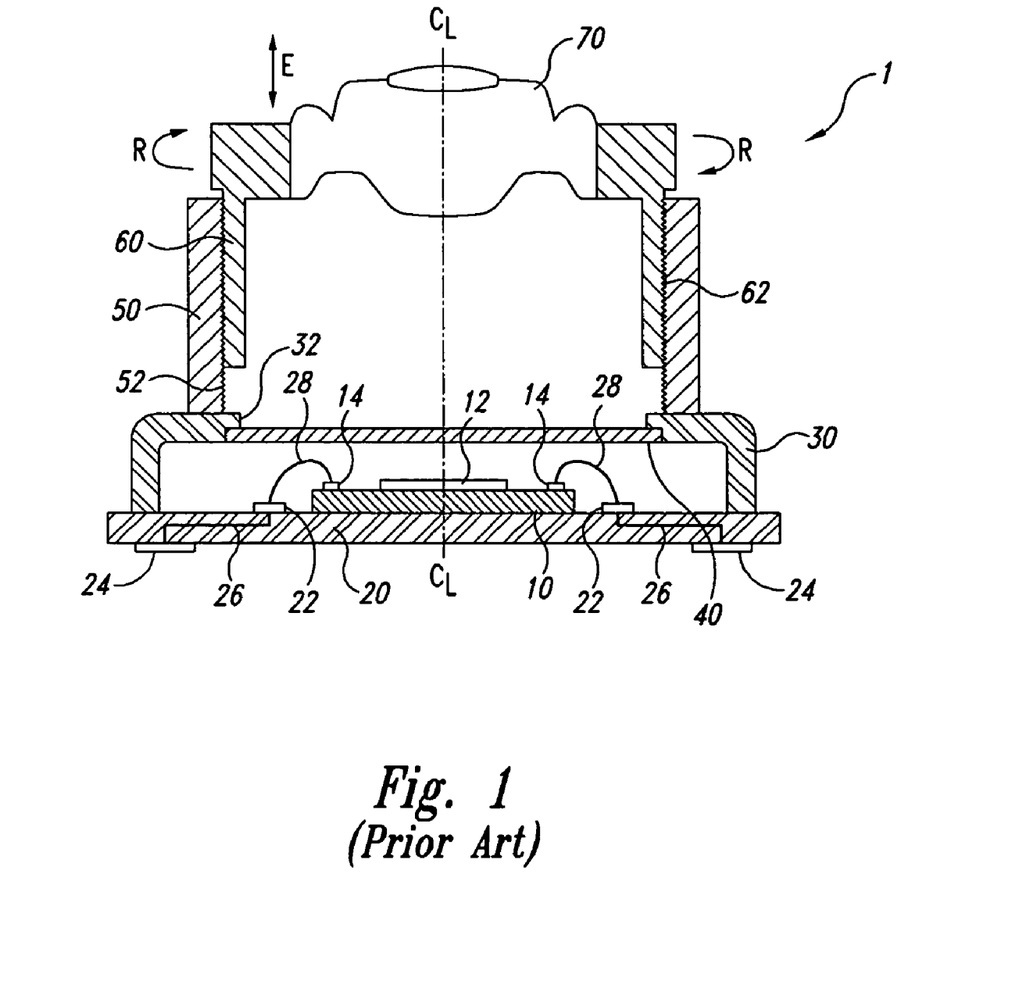
FIG. 1 is a schematic side cross-sectional view of a packaged microelectronic imager in accordance with the prior art.

FIG. 1 is a schematic view of a conventional microelectronic imager 1 with a conventional package. The imager 1 includes a die 10, an interposer substrate 20 attached to the die 10, and a housing 30 attached to the interposer substrate 20. The housing 30 surrounds the periphery of the die 10 and has an opening 32. The imager 1 also includes a transparent cover 40 over the die 10.

The die 10 includes an image sensor 12 and a plurality of bond-pads 14 electrically coupled to the image sensor 12. The interposer substrate 20 is typically a dielectric fixture having a plurality of bond-pads 22, a plurality of ball-pads 24, and traces 26 electrically coupling bond-pads 22 to corresponding ball-pads 24. The ball-pads 24 are arranged in an array for surface mounting the imager 1 to a board or module of another device. The bond-pads 14 on the die 10 are electrically coupled to the bond-pads 22 on the interposer substrate 20 by wire-bonds 28 to provide electrical pathways between the bond-pads 14 and the ball-pads 24.

The imager 1 shown in FIG. 1 also has an optics unit including a support 50 attached to the housing 30 and a barrel 60 adjustably attached to the support 50. The support 50 can include internal threads 52, and the barrel 60 can include external threads 62 engaged with the threads 52. The optics unit also includes a lens 70 carried by the barrel 60.

One problem with conventional packaged microelectronic imagers is that they have relatively large footprints and occupy a significant amount of vertical space (i.e., high profiles). For example, the footprint of the imager 1 in FIG. 1 is the surface area of the bottom of the interposer substrate 20, which is significantly larger than the surface area of the die 10. Accordingly, the footprint of conventional packaged microelectronic imagers can be a limiting factor in the design and marketability of picture cell phones or PDAs because these devices are continually shrinking to be more portable. Therefore, there is a need to provide microelectronic imagers with smaller footprints and lower vertical profiles.

Another problem with conventional microelectronic imagers is the manufacturing costs for packaging the dies. For example, forming the wire-bonds 28 on the imager 1 shown in FIG. 1 is complex and expensive because it requires connecting an individual wire between each bond-pad 14 on the die 10 and a corresponding pad 22 on the interposer substrate 20. In addition, it may not be feasible to form wire-bonds for the high-density, fine-pitch arrays of some high-performance devices. Moreover, the support 50 and barrel 60 are assembled separately for each die 10 individually after the dies have been singulated from a wafer and attached to the interposer substrate. Therefore, there is a significant need to enhance the efficiency and reliability of packaging microelectronic imagers.

DETAILED DESCRIPTION

A. Overview

The following disclosure describes several embodiments of microelectronic imagers, methods for packaging microelectronic imagers, and methods for forming support members carried by microelectronic imagers. One particular embodiment of the invention is directed toward a microelectronic imaging unit comprising a microelectronic die including a microelectronic substrate, an integrated circuit, and an image sensor electrically coupled to the integrated circuit. The imaging die also includes a plurality of electrical terminals (e.g., bond-pads) that are electrically coupled to the integrated circuit. The imaging die further includes an electrically conductive through-wafer interconnect extending through the die. A portion of the interconnect contacts the bond-pad. The die further includes a support member projecting from the bond-pad. The support member can be an integral extension of the interconnect or a separate component. The die can also have a cover carried by the support member over the image sensor.

Another particular embodiment of the invention is directed to a microelectronic imaging unit similar to the imaging unit described above. In this embodiment, however, an image sensor is not placed on the die until after the interconnect and support member have been formed through and/or on the die.

In another embodiment, the microelectronic imager includes a microelectronic substrate, an integrated circuit, and an image sensor electrically coupled to the integrated circuit. The imager also includes a plurality of bond-pads electrically coupled to the integrated circuit and a plurality of through-wafer interconnects extending through the die and in contact with corresponding bond-pads. The imager also includes support members carried by and projecting from corresponding bond-pads and a cover over the image sensor. The cover is carried by at least one of the support members. The imager can further include a stand-off on the cover and an optics unit coupled to the stand-off. The optics unit can include an optic member positioned at a desired location relative to the image sensor on the imager.

Another embodiment of the invention is directed toward a method for packaging microelectronic imagers. The method can include providing a microelectronic die having an integrated circuit and an image sensor electrically coupled to the integrated circuit. The method can further include forming a bond-pad on the substrate and electrically coupling the bond-pad to the integrated circuit. The method continues by forming a passage through the die and constructing an interconnect in at least a portion of the passage. The interconnect contacts the bond-pad to provide an array of electrical contacts on the backside of the die. The method further includes forming a support member projecting from the bond-pad. The support member, for example, can be integral with or otherwise contact the interconnect and/or the bond-pad. A cover can then be coupled to the support member over the image sensor.

Many specific details of the present invention are described below with reference to microfeature workpieces. The term "microfeature workpiece" is used throughout this disclosure to include substrates upon which and/or in which microelectronic devices, micromechanical devices, data storage elements, read/write components, and other features are fabricated. For example, such microfeature workpieces can include semiconductor wafers (e.g., silicon or gallium arsenide wafers), glass substrates, insulated substrates, and many other types of substrates. The feature sizes in microfeature workpieces can be 0.11 µm or less, but microfeature workpieces can have larger submicron or supra-micron features.

Specific details of several embodiments of the invention are described below with reference to microelectronic imager dies and other microelectronic devices in order to provide a thorough understanding of such embodiments. Other details describing well-known structures often associated with microelectronic devices are not set forth in the following description to avoid unnecessarily obscuring the description of the various embodiments. Persons of ordinary skill in the art will understand, however, that the invention may have other embodiments with additional elements or without several of the elements shown and described below with reference to FIGS. 2A–6.

In the FIGS, identical reference numbers identify identical or at least generally similar elements. To facilitate the discussion of any particular element, the most significant digit or digits of any reference number refer to the FIG. in which that element is first introduced. For example, element 210 is first introduced and discussed with reference to FIG. 2.

B. Embodiments of Microelectronic Imagers

Figure 2A:
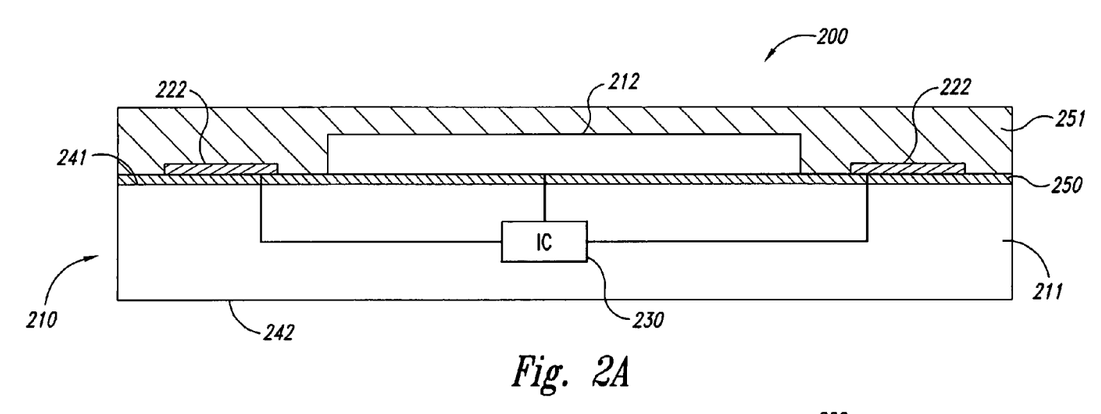
FIGS. 2A–2G are schematic side cross-sectional views illustrating various stages in a method of forming electrically conductive interconnects and support members through and/or carried by a microelectronic imager in accordance with an embodiment of the invention.

FIGS. 2A–2H illustrate various stages in a method of forming electrically conductive through-wafer interconnects and support members through and/or carried by an imaging unit 200 in accordance with one embodiment of the invention. FIG. 2A, more specifically, is a schematic side cross-sectional view of an imaging unit 200. In the illustrated embodiment, the imaging unit 200 includes a die 210 having a substrate 211 with a first side 241 and a second side 242 opposite the first side 241, an integrated circuit 230 (shown schematically), and an image sensor 212 electrically coupled to the integrated circuit 230. The image sensor 212 can be a CMOS device or a CCD for capturing pictures or other images in the visible spectrum. In other embodiments, the image sensor 212 can detect radiation in other spectrums (e.g., IR or UV ranges). The die 210 also includes a plurality of bond-pads 222 electrically coupled to the integrated circuit 230. FIG. 2A and subsequent FIGS. illustrate the various stages of forming electrically conductive interconnects and support members for two bond-pads 222. It will be appreciated, however, that a plurality of through-wafer interconnects and/or support members are constructed simultaneously for a plurality of bond-pads 222 on a die 210.

The die 210 can also include a first dielectric layer 250 over the first side 241 of the die 210 and a second dielectric layer 251 over the first dielectric layer 250. The second dielectric layer 251 can also cover the bond-pads 222 and image sensor 212. The second dielectric layer 251 protects the image sensor 212 from damage when the die 210 is handled in subsequent packaging steps. The first and second dielectric layers 250, 251, and/or one or more subsequent dielectric layers, can be a low temperature chemical vapor deposition (low temperature CVD) material, such as tetraethylorthosilicate (TEOS), parylene, silicon nitride ($Si_3N_4$), silicon oxide ($SiO_2$), and/or other suitable materials. The foregoing list of dielectric and dielectric material options is not exhaustive. The dielectric layers 250, 251 are generally composed of different materials, but it is possible that two or more of these layers are composed of the same material. In addition, one or more of the layers described above with reference to FIG. 2A, or described below with reference to subsequent FIGS, may be omitted.

Figure 2B:
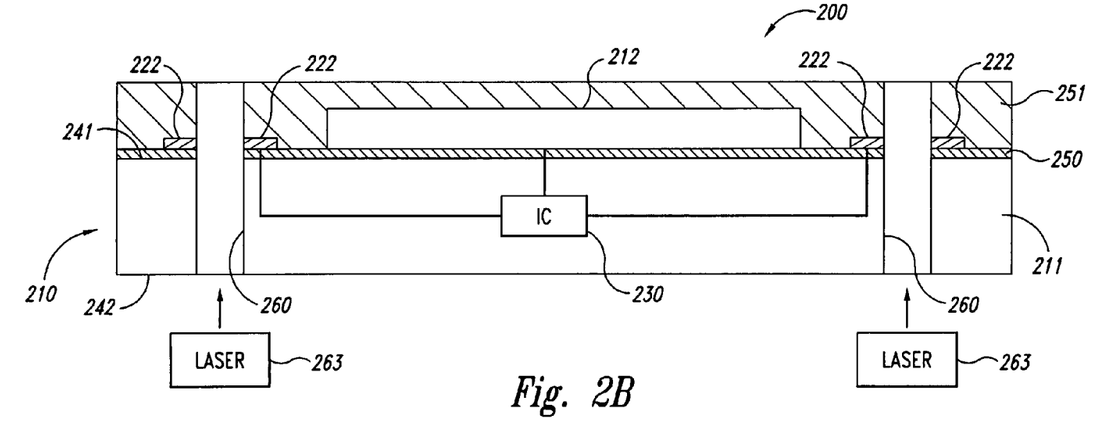

FIG. 2B illustrates cutting passages or through-holes 260 through the microelectronic imaging unit 200. Each through-hole 260 can extend through the substrate 211, the corresponding bond-pad 222, the first dielectric layer 250, and the second dielectric layer 251. The through-holes 260 can be formed using a laser 263 (shown schematically) to cut from the second side 242 of the substrate 211 toward the first side 241. In a different embodiment, the laser 263 can conceivably cut from the first side 241 toward the second side 242. The laser 263 can be aligned with respect to the corresponding bond-pads 222 using scanning/alignment systems known in the art.

After forming the through-holes 260, they are cleaned to remove ablated byproducts (i.e., slag) and/or other undesirable byproducts resulting from the laser cut. The through-holes 260 can be cleaned using cleaning agents that do not attack or otherwise degrade the metal of the bond-pads 222. For example, one such cleaning agent may include 6% tetramethylammonium hydroxide in propylene glycol for removing laser ablated byproducts. In other embodiments, the through-holes 260 can be cleaned using other methods.

Alternatively, in certain other embodiments, the through-holes 260 are not cleaned after formation.

In other embodiments, the through-holes 260 can be formed by suitable etching processes. For example, the through-holes 260 can be etched using one or more etching steps that selectively remove material from the substrate 211 and dielectric layers 250, 251 compared to the bond-pad 222. An etching process used to form a hole through the second dielectric layer 251 and/or the hole 260 through the substrate 211 can be different than an etching process used to form a hole through the bond-pad 222.

Figures 2C, 2D:
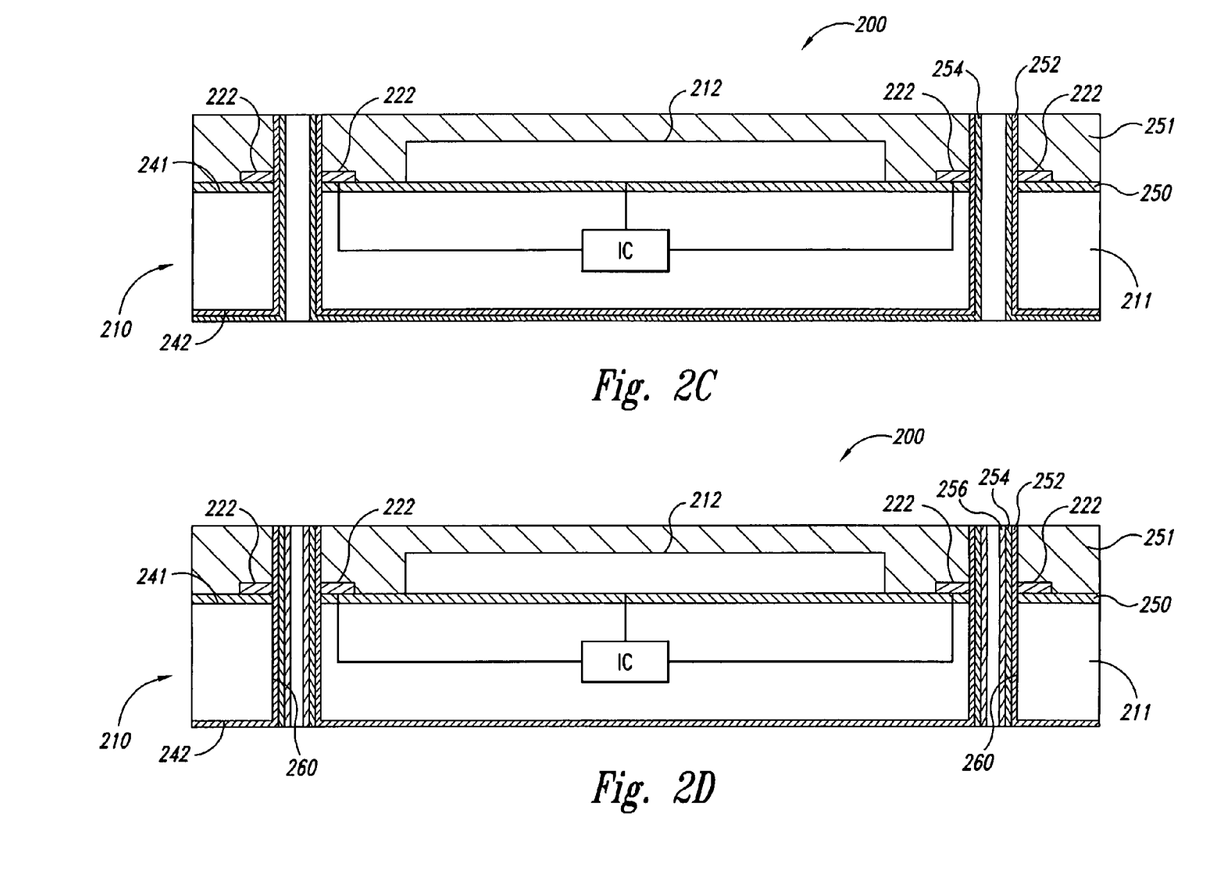

Referring next to FIG. 2C, a third dielectric layer 252 is applied to the die 210 to cover the second side 242 of the die 210 and the sidewalls of the through-holes 260. The third dielectric layer 252 can be applied in a number of different ways. For example, in the illustrated embodiment the third dielectric layer 252 is applied to the die 210 so that it covers the exposed portions of the substrate 211, the bond-pads 222, and the second dielectric layer 251 in the through-hole 260. In one embodiment the third dielectric layer 252 can be a low temperature CVD oxide, but in other embodiments the third dielectric layer 252 can be other suitable dielectric materials. The third dielectric layer 252 electrically insulates the components of the die 210 from an interconnect that is subsequently formed in the through-holes 260, as described in greater detail below.

After applying the third dielectric layer 252, a first conductive layer 254 is deposited onto the die 210. In the illustrated embodiment, the first conductive layer 254 covers the entire third dielectric layer 252. The first conductive layer 254 is generally a metal layer, such as a TiN layer, but in other embodiments the first conductive layer 254 can be other materials suitable for a particular application. When the first conductive layer 354 is composed of TiN, it can be formed using TiCl$_4$TiN and an atomic layer deposition or chemical vapor deposition process. As explained below, the first conductive layer 254 provides a material for plating another layer of metal onto only selected areas of the wafer (e.g., in the through-holes 360).

Referring next to FIG. 2D, portions of the first conductive layer 254 are removed from the horizontal and diagonal surfaces of the imaging unit 200. In one embodiment, such portions of the first conductive layer 254 are removed from these surfaces by a suitable etching process, such as a "dry etch" or "spacer etch" process that preferentially removes material from horizontal surfaces and other surfaces having transverse components relative to the direction of the etchant. In other embodiments, different processes can be used to selectively remove non-vertical portions of the first conductive layer 254 so that the vertical portions of the first conductive layer 254 on the sidewalls in the through-holes 260 remain on the workpiece.

After removing the selected portions of the first conductive layer 254, a second conductive layer 256 is deposited onto the remaining portions of the first conductive layer 254. The second conductive layer 256 can act as a wetting agent to facilitate subsequently depositing additional conductive material into the through-holes 260. In one embodiment, the second conductive layer 256 can be Ni that is deposited onto a first conductive layer 254 composed of TiN in an electroless plating operation. In this embodiment, when the TiN is activated by an HF:Pd wet dip, it provides nucleation for the Ni during the plating process. The plating process may also be performed using an activationless Ni chemistry with reduced stabilizer content. The TiN can enhance the adhesion and electrical properties to induce nucleation. In other embodiments, the second conductive layer 256 can be other suitable materials, and/or one or more of the first and second conductive layers 254, 256 may be omitted.

Figure 2E:
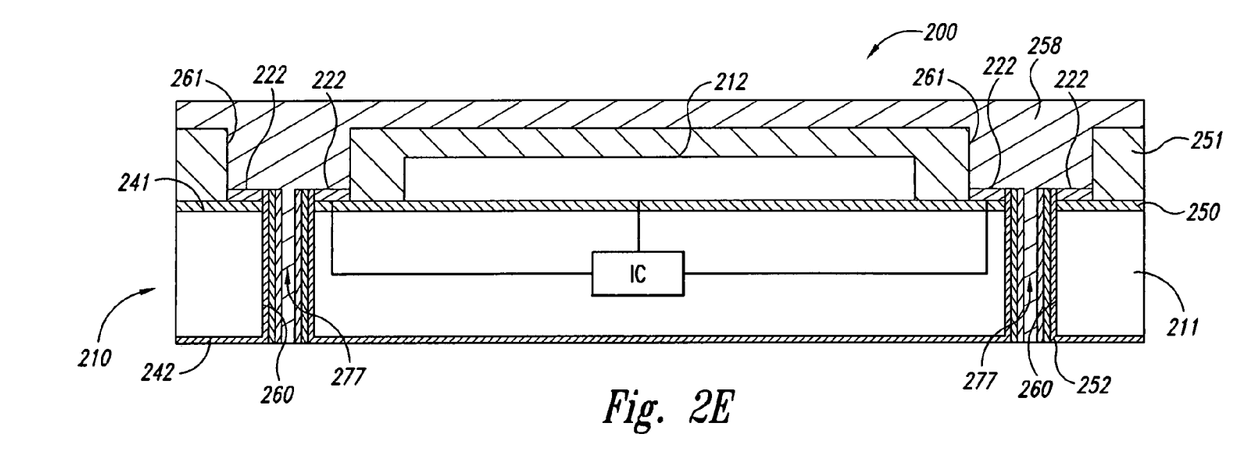

Referring next to FIG. 2E, portions of the first dielectric layer 251 are removed from the bond-pads 222 by etching the first dielectric layer 251 to form openings 261 that expose the bond-pads 222. In other embodiments, the first dielectric layer 251 can be removed around the bond-pads 222 using other suitable processes, including laser drilling. In this embodiment, the etching process should be terminated before damaging the bond-pads 222. A conductive fill material 258 is then deposited into the through-holes 260 and openings 261 to form interconnects 277 extending through the die 210. The conductive fill material 258 can also cover the first dielectric layer 251. The fill material 258 can be solder or other electrically conductive materials. Various methods can be used to deposit the fill material 258 onto the die 210. For example, the fill material 258 can be deposited by electroplating, stenciling, or other methods known to those of skill in the art.

Figure 2F:
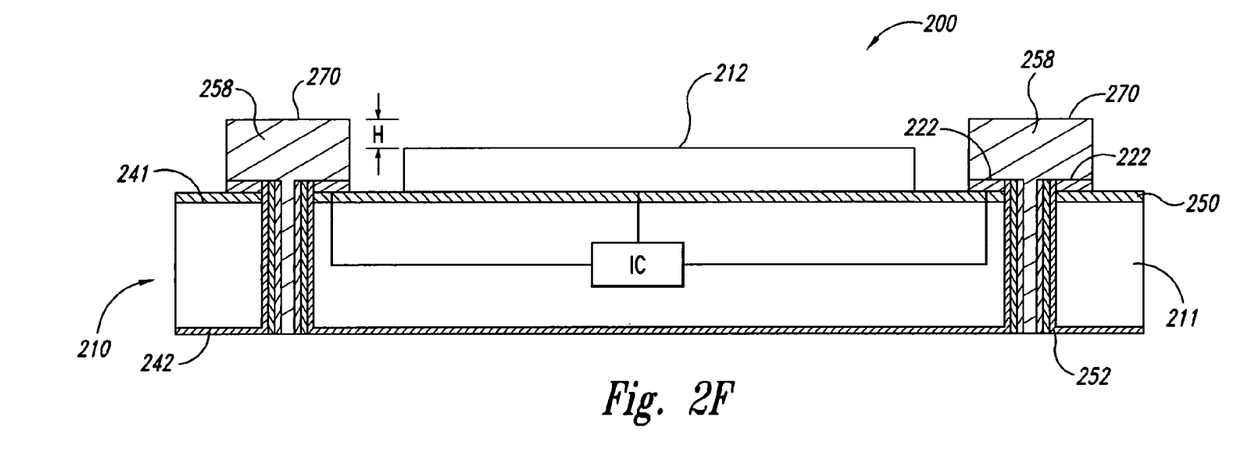

Referring next FIGS. 2E and 2F, the overburden portion of the fill material 258 on the first dielectric layer 251 shown in FIG. 2E is removed to leave fill material 258 in the through-holes 260 and the openings 261. The upper portion of the fill material 258 can be removed using a chemical-mechanical planarization process (CMP) and/or an etching process. The fill material 258 left in the openings 261 over the bond-pads 222 forms support members 270 projecting from at least a portion of corresponding bond-pads 222 on the die 210. The support members 270 in the embodiment shown in FIG. 2F are electrically coupled to corresponding bond-pads 222 and integral with corresponding interconnects 277. The first dielectric layer 251 is then removed from the first side 241 of the die 210 using a suitable etching and/or washing process that does not damage the image sensor 212.

The support members 270 are constructed to have a desired height "H" relative to the image sensor 212 for mounting a cover plate or other optical component to the imaging unit 200. CMP processes are highly accurate and can provide good control of the height H across a workpiece having a large number of imaging units 200. As such, the support members 270 are expected to provide an exceptionally accurate reference elevation for mounting optical components on the imaging unit 200 in subsequent packaging steps.

Figure 2G:
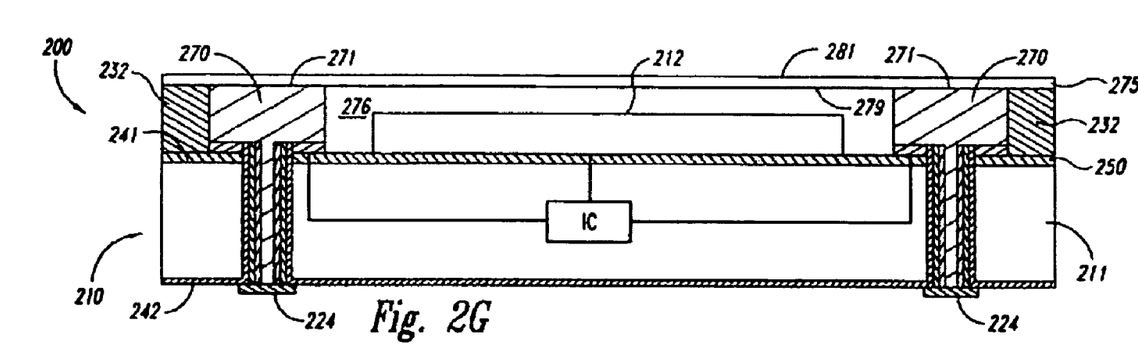

Referring next to FIG. 2G, an adhesive 271 is applied to the support members 270 and a cover 275 is mounted onto the support members 270. The cover 275 has a first side 281 facing generally away from the image sensor 212 and a second side 279 facing generally toward the image sensor 212. The cover 275 and the support members 270 form an enclosure 276 for protecting the image sensor 212. In another embodiment, the cover 275 can be mounted to the support members 270 in a chamber containing an inert gas. The inert gas is trapped in the enclosure 276 and decreases yellowing of the image sensor 212 caused by oxygen. The cover 275 can be glass, quartz, or other materials transmissive to a desired spectrum of radiation. In embodiments directed toward imaging radiation in the visible spectrum, the cover 275 can also filter infrared radiation or other undesirable spectrums of radiation. The cover 275, for example, can be formed from a material and/or can have a coating that filters IR or near IR spectrums.

An underfill material 232 is deposited around the periphery of each bond-pad 222 and support member 270. The underfill material 232 enhances the integrity of the joint between the cover 275 and the microelectronic die 210 to protect the image sensor 212, support member 270, and bond-pad 222 from moisture, chemicals, and other contaminants. In other embodiments, the underfill material 232 may be deposited in other locations on the die 210 or the underfill material 232 may be omitted.

An array of ball-pads 224 is then attached to corresponding interconnects 277 at the second side 242 of the die 210 to provide an external connection to other electronic devices on the backside of the die 210. Solder balls (not shown) can be placed on the ball-pads 224 to attach the die 210 to a module or other board. In other embodiments, conductive pastes or other electrical couplers may be placed on the interconnects 277.

Figure 3:
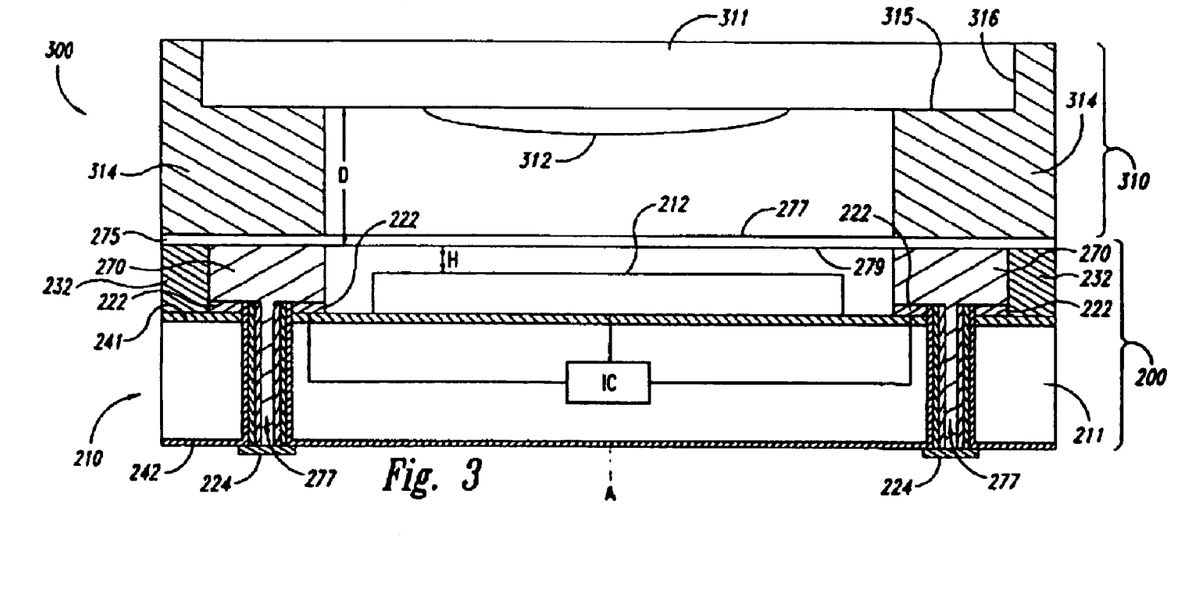
FIG. 3 is a schematic side cross-sectional view illustrating a microelectronic imager in accordance with an embodiment of the invention.

FIG. 3 is a schematic cross-sectional view of a microelectronic imager 300 in accordance with an embodiment of the invention. The imager 300 includes the imaging unit 200 and an optics unit 310 attached to the imaging unit 200. The optics unit 310 is positioned to transmit at least the desired spectrum of radiation to the image sensor 212 on the imaging unit 200. The embodiment of the optics unit 310 shown in FIG. 3 includes a substrate 311, an optic member 312 on the substrate 311, and a stand-off 314 attached to the substrate 311. The substrate 311, which can be glass, quartz, or another material, can be coated to filter infrared radiation from the visible light spectrum. The optic member 312 is a lens for focusing or otherwise directing the radiation. In other embodiments, the optic member 312 can include other optical structures for performing other functions. The stand-off 314 carries and positions the substrate 311 and the optic member 312 at a desired location relative to the image sensor 212. For example, the stand-off 314 can be a cylindrical or rectilinear member having a step 315 at a distance "D" from the reference elevation defined by the top of the support members 270 and a sidewall 316 at a desired distance from an alignment axis A—A of the image sensor 212. The step 315 and support members 270 accurately position the optic member 312 at a desired distance from the image sensor 212. The sidewall 316 similarly precisely aligns the optic member 312 with the alignment axis A—A. The step 315 and sidewall 316 accordingly define a reference element for positioning the optic member 312 relative to the image sensor 212. The stand-off 314 may include configurations such as those described in U.S. patent application Ser. No. 10/723,363, entitled "Packaged Microelectronic Imagers and Methods of Packaging Microelectronic Imagers," filed on Nov. 26, 2003, which is incorporated by reference herein in its entirety. In further embodiments, the imaging unit 200 may not include an optics unit 310 as shown in FIG. 3.

The embodiment of the microelectronic imager 300 shown in FIG. 3 provides several advantages compared to the conventional imager shown in FIG. 1. First, the microelectronic imager 300 can be much smaller than the conventional imager. The footprint of the microelectronic imager 300 can be as small as the size of the die 210 because the interconnects 277 provide an electrical connection to an array of ball-pads 224 on the second side 242 of the die 210 instead of using wire-bonds. The through-wafer interconnects 277 accordingly eliminate the need for an interposer substrate, and thus the additional footprint of the interposer substrate is also eliminated. Second, the height of the microelectronic imager 300 is also less than that of conventional imagers because the imager 300 is not mounted to an interposer substrate. Therefore, the microelectronic imager 300 has a lower profile than conventional imagers and can be used in smaller electronic devices, such as picture cell phones, PDAs, or other applications where space is limited.

Another advantage of the imager 300 is that the support members 270 eliminate the need for forming additional spacers around the image sensor 212 to position and support the cover 275. The support members 270 also provide an exceptionally precise reference elevation for mounting the cover 275 and optics unit 310 because of the precision provided by removing the overburden of the fill material 258 using CMP processing as described above with reference to FIG. 2F. Accordingly, the manufacturing process is more efficient and accurate than processes that deposit beads of material around the image sensors to form spacers on the die 210. Another advantage of this feature is that the footprint of each microelectronic imager 300 is smaller because the electrically conductive support members 270 are positioned on at least a portion of each corresponding bond-pad 222 rather than outboard of the bond-pads 222.

Figure 4:
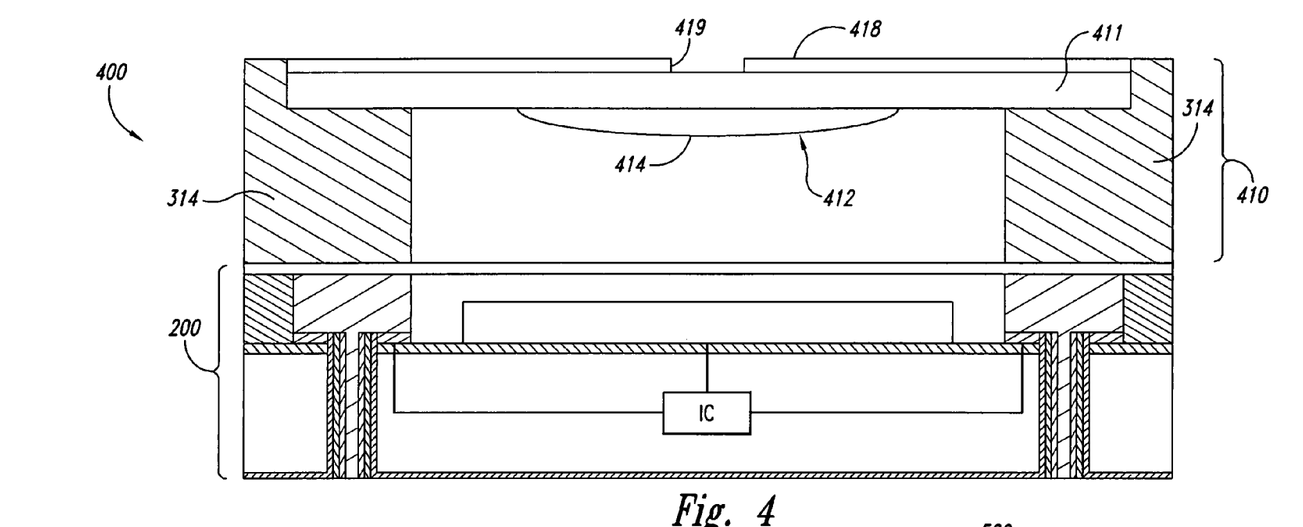
FIG. 4 is a schematic side cross-sectional view illustrating a microelectronic imager in accordance with another embodiment of the invention.

FIG. 4 is a schematic side cross-sectional view of a microelectronic imager 400 in accordance with another embodiment of the invention. The imaging unit 200 can be generally similar to the imaging unit 200 shown in FIG. 3; like reference numbers accordingly refer to like components in FIGS. 3 and 4. In this embodiment, an optics unit 410 includes a substrate 411, the stand-off 314, and an optic member 412. The optic member 412 includes a first lens 414 and a second lens 418. The first lens 414 can be a focus or dispersion lens, and the second lens 418 can be a pinhole lens having a pinhole 419. The pinhole lens 418 can be a layer of material deposited on the substrate 411, and the pinhole 419 can be etched or laser drilled through the layers of material. In other embodiments, the microelectronic imagers 300 and 400 can include different optical structures for performing different functions.

Figure 5:
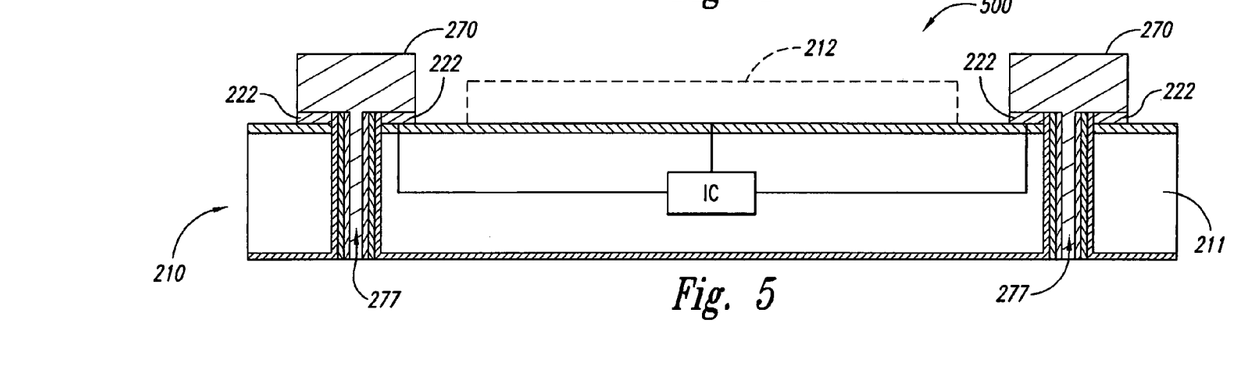
FIG. 5 is a schematic side cross-sectional view illustrating a microelectronic imager in accordance with another embodiment of the invention.

FIG. 5 illustrates a stage in a method of forming electrically conductive through-wafer interconnects and support members in an imaging unit 500 in accordance with another embodiment of the invention. The initial stages of this method are at least generally similar to the steps described above with reference to FIGS. 2A–2F, and thus FIG. 5 shows a workpiece configuration similar to that illustrated in FIG. 2F. The subsequent stages of this method, however, differ from that described above with reference to FIGS. 2A–2F in that the image sensor (not shown) is not constructed on the imaging unit 500 until after the interconnects 277 and support members 270 have been formed. After forming an image sensor 212 (shown in phantom) on the die 210, the imaging unit 500 can undergo additional packaging steps that are at least generally similar to those described above with reference to FIG. 2G to package the imagers illustrated in FIG. 3 or FIG. 4.

The embodiments described above with reference to FIGS. 2A–5 include various methods for forming and/or filling through-holes in microelectronic workpieces that extend through bond-pads and/or associated substrates. In other embodiments, other methods can be used to form and/or fill such through-holes. Accordingly, the present invention is not limited to the particular methods for forming and/or filling the through-holes described above, but it also includes alternative methods for providing a conductive fill material in a through-hole to form an array of ball-pads on the backside of the imager and support members on the front side of the imager projecting from the bond-pads.

C. Microelectronic Imagers With Through-Wafer Interconnects

Figure 6:
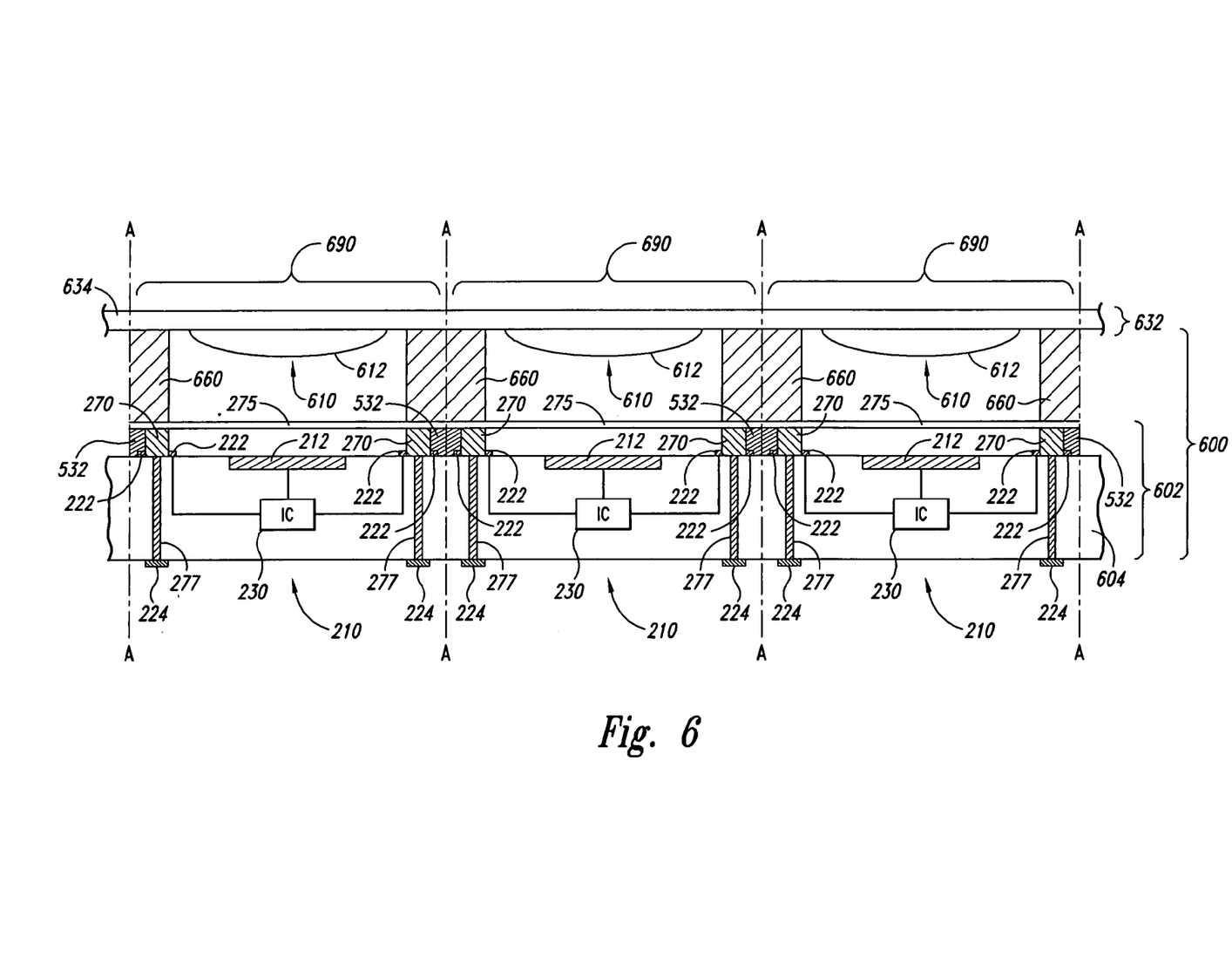
FIG. 6 is a schematic side cross-sectional view of a plurality of microelectronic imagers formed on a microfeature workpiece in accordance with another embodiment of the invention.

FIG. 6 is a schematic cross-sectional view of an assembly 600 including a plurality of microelectronic imagers 690 that each include an imaging die 210 and an optics unit 610. The assembly 600 includes a microelectronic imager workpiece 602 having a first substrate 604 and a plurality of imaging dies 210 formed in and/or on the first substrate 604. The individual imaging dies 210 can be generally similar to the imaging die 210 described above with respect to FIG. 2H; like reference numbers accordingly refer to like components in FIGS. 2H and 6. The assembly 600 also includes an optics workpiece 630 that includes a second substrate 634 and a plurality of optics units 610 on the second substrate 634. Individual optic units 610 can include an optic member 612 on the second substrate 634. The optic member 612 can include lenses and/or filters for manipulating the radiation passing through the optics unit 610.

The assembly 600 further includes a plurality of stand-offs 660 configured to position individual optic units 610 with respect to individual image sensors 212. Suitable stand-offs are disclosed in U.S. patent application Ser. No. 10/723,363 incorporated by reference above. The microelectronic imagers 690 can be assembled by seating the stand-offs 660 so that the optics units 610 are accurately aligned with the image sensors 212. In one embodiment, the stand-offs 660 are seated before singulating the individual imagers 690 such that all of the microelectronic imagers are assembled at the wafer level. Both of the first and second substrates 604 and 634 can then be cut along lines A—A to separate individual imagers 690 from each other.

One advantage of the assembly 600 of microelectronic imagers 690 illustrated in FIG. 6 is that the through-wafer interconnects enable a plurality of microelectronic imagers to be fabricated at the wafer level using semiconductor fabrication techniques. Because the through-wafer interconnects provide an array of ball-pads on the backside of the imaging dies 210, it is not necessary to wire-bond the bond-pads on the front side of the wafer to external devices. The bond-pads can accordingly be covered at the wafer level. This enables the process of (a) fabricating a plurality of imaging dies 210 at the wafer level on one substrate, (b) fabricating a plurality of optics units 610 at the wafer level on another substrate, and (c) assembling a plurality of optic units 610 with a corresponding plurality of imaging dies 210 at the wafer level using automated equipment. Therefore, the microelectronic imagers 690 with through-wafer interconnects enable processes that significantly enhance the throughput and accuracy of packaging microelectronic imagers.

Another advantage of the assembly 600 of microelectronic imagers 690 is the ability to decrease the real estate that the imagers 690 occupy in a cell phone, PDA, or other type of device. Because the imagers 690 do not require an interposer substrate to provide external electrical contacts in light of the through-wafer interconnects 277, the footprint of the imagers 690 can be the same as that of the die 210 instead of the interposer substrate. The area occupied by the imagers 690 is accordingly less than conventional imagers because the footprint of the individual imaging dies 210 is significantly smaller than that of the interposer substrate. Furthermore, because the dies 210 provide a backside array of ball-pads 224 that can be coupled directly to a module without an interposer substrate, the profile is lower and the time and costs associated with mounting the die to the interposer substrate are eliminated. This results in greater throughput, lower packaging costs, and smaller imagers.

A further advantage of wafer-level imager packaging is that the microelectronic imagers 690 can be tested from the backside of the dies 210 at the wafer level before the individual imagers 690 are singulated. A test probe can contact the backside of the dies 210 to test the individual microelectronic imagers 690 because the through-wafer interconnects 277 provide backside electrical contacts. Accordingly, because the test probe engages contacts on the backside of the imager workpiece 602, it will not damage the image sensors 212, the optics units 640, or associated circuitry on the front of the microelectronic imagers 690. Moreover, the test probe does not obstruct the image sensors 212 during a backside test, which allows the test probe to test a larger number of dies at one time compared to processes that test imaging dies from the front side. As such, it is more efficient in terms of cost and time to test the microelectronic imagers 690 at the wafer level (i.e., before singulation) than to test each imager 690 from the front side of the dies 210. Furthermore, it is advantageous to test the microelectronic imagers 690 in an environment where the individual image sensors 212 and/or optics units 640 will not be damaged during testing.

Yet another advantage of wafer-level processing is that the microelectronic imagers 690 can be singulated after assembling the optics units 640 to the dies 210. The attached optics units 640 protect the imager sensors 212 on the front side of the dies 210 from particles generated during the singulation process. Thus, the likelihood that the image sensors 212 or associated circuitry on the front side of the dies 210 will be damaged during singulation and subsequent handling is significantly reduced.

From the foregoing, it will be appreciated that specific embodiments of the invention have been described herein for purposes of illustration, but that various modifications may be made without deviating from the spirit and scope of the invention. For example, the microelectronic imagers can have any combination of the features described above with reference to FIGS. 2A–6. Accordingly, the invention is not limited except as by the appended claims.

We claim:

1. A microelectronic imaging unit, comprising:
   a microelectronic die including an image sensor, an integrated circuit electrically coupled to the image sensor, and a terminal electrically coupled to the integrated circuit;
   an electrically conductive interconnect extending through the die and in contact with the terminal;
   an electrically conductive support member carried by the terminal; and
   a cover on the support member and over the image sensor.

2. The microelectronic imaging unit of claim 1 wherein:
   the die includes a first side and a second side opposite the first side, and wherein the image sensor and terminal are on the first side of the die;
   the cover includes a first side facing generally away from the image sensor and a second side facing generally toward the image sensor; and
   the electrically conductive support member engages the second side of the cover and spaces the cover apart from the image sensor by a desired distance.

3. The microelectronic imaging unit of claim 1 wherein the support member comprises an electrically conductive member projecting from the terminal.

4. The microelectronic imaging unit of claim 1, further comprising an optics unit coupled to the cover, wherein the optics unit includes an optic member positioned at a desired location relative to the image sensor.

5. The microelectronic imaging unit of claim 1, further comprising:
   a stand-off projecting from the cover, the stand-off having a step and a sidewall defining a referencing element; and an optics unit having a substrate and an optic member on the substrate, the substrate being seated with the referencing element to position the optic member at a desired location relative to the image sensor.

6. The microelectronic imaging unit of claim 1 wherein:
the interconnect has a first end portion and a second end portion spaced apart from the first end portion;
the support member projects from the first end portion of the interconnect; and
the die further comprises a ball-pad electrically coupled to the second end portion of the interconnect.

7. The microelectronic imaging unit of claim 1 wherein:
the interconnect has a first end portion and a second end portion spaced apart from the first end portion;
the support member is integral with the interconnect and projects from the first end portion of the interconnect; and
the die further comprises a solder ball electrically coupled to the second end portion of the interconnect.

8. The microelectronic imaging unit of claim 1 wherein:
the die includes a substrate and a passage extending completely through the substrate and the terminal; and
the interconnect comprises a dielectric liner disposed on the sidewalls of the passage and in contact with the die, a conductive layer over at least a portion of the dielectric liner, wherein the conductive layer includes TIN, a plated metal over at least a portion of the conductive layer, wherein the plated metal includes Ni, and a metal fill disposed in the passage over at least a portion of the wetting agent and electrically coupled to the terminal.

9. A microelectronic imaging unit, comprising:
a microelectronic die having a first side and a second side opposite the first side;
an image sensor on the first side of the die;
an integrated circuit in the die and electrically coupled to the image sensor;
an array of bond-pads on the first side of the die, the individual bond-pads being electrically coupled to the integrated circuit;
a plurality of electrically conductive interconnects extending through the die and in contact with corresponding bond-pads;
a plurality of discrete support members projecting from corresponding bond-pads; and
a cover over the image sensor and attached to the support members.

10. The microelectronic imaging unit of claim 9 wherein the individual support members comprise electrically conductive members projecting from each corresponding bond-pad, and wherein the individual support members are electrically coupled to corresponding interconnects and bond-pads.

11. The microelectronic imaging unit of claim 9, further comprising an optics unit coupled to the cover, wherein the optics unit includes an optic member positioned at a desired location relative to the image sensor.

12. The microelectronic imaging unit of claim 9, further comprising:
a stand-off projecting from the cover, the stand-off having a step and a sidewall defining a referencing element; and
an optics unit having a substrate and an optic member on the substrate, the substrate being seated with the referencing element to position the optic member at a desired location relative to the image sensor.

13. The microelectronic imaging unit of claim 9 wherein:
the cover includes a first side facing generally away from the image sensor and a second side facing generally toward the image sensor; and
the individual support members engage the second side of the cover and space the cover apart from the image sensor by a desired distance.

14. The microelectronic imaging unit of claim 9 wherein:
the die includes a substrate and a passage extending completely through the substrate and the corresponding bond-pad; and
the interconnect comprises a dielectric liner disposed on the sidewalls of the passage and in contact with the die, a conductive layer over at least a portion of the dielectric liner, wherein the conductive layer includes TiN, a plated metal over at least a portion of the conductive layer, wherein the plated metal includes Ni, and a metal fill disposed in the passage over at least a portion of the wetting agent and electrically coupled to the corresponding bond-pad.

15. The microelectronic imaging unit of claim 9 wherein:
the individual interconnects have a first end portion and a second end portion spaced apart from the first end portion;
the individual support members project from the first end portions of each interconnect; and
the die further comprises an array of ball-pads on the second side of the die coupled to corresponding second end portions of each interconnect.

16. The microelectronic imaging unit of claim 9 wherein:
the individual interconnects have a first end portion and a second end portion spaced apart from the first end portion;
the individual support members are integral with the interconnect and project from the first end portions of each interconnect; and
the microelectronic die further comprises a solder ball electrically coupled to the second end portion of at least one interconnect.

17. The microelectronic imaging unit of claim 9 wherein the cover includes glass, quartz, or other materials transmissive to a desired spectrum of radiation.

18. A microelectronic imaging unit, comprising:
a microelectronic die including a substrate, an image sensor space for forming an image sensor, an integrated circuit configured to be coupled to an image sensor in the space, and a bond-pad electrically coupled to the integrated circuit, wherein the die does not include an image sensor;
a plurality of through-wafer interconnects extending through the die and contacting corresponding bond-pads; and
a plurality of support members projecting from corresponding through-wafer interconnects.

19. The microelectronic imaging unit of claim 18, further comprising:
a cover over at least a portion of the image sensor space and coupled to the support member; and
an optics unit attached to the cover, the optics unit including an optic member positioned at a desired location relative to the image sensor space.

20. The microelectronic imaging unit of claim 18 wherein:
the substrate includes a passage extending completely through the substrate and the bond-pad; and
the interconnect comprises a dielectric liner disposed on the sidewalls of the passage and in contact with the die, a conductive layer over at least a portion of the dielectric liner, wherein the conductive layer includes TiN, a plated metal over at least a portion of the conductive layer, wherein the plated metal includes Ni, and a metal fill disposed in the passage over at least a portion of the wetting agent and electrically coupled to the bond-pad.

21. The microelectronic imaging unit of claim 18 wherein:
the interconnect has a first end portion and a second end portion spaced apart from the first end portion;
the support members are integral with corresponding first end portions of the interconnects; and
the die further comprises a ball-pad on the second side of the die electrically coupled to the second end portion of the interconnect.

22. A microfeature workpiece, comprising:
a plurality of microelectronic dies, wherein individual dies include an image sensor, an integrated circuit electrically coupled to the image sensor, an array of bond-pads electrically coupled to the integrated circuit, a plurality of interconnects extending through the die and in contact with corresponding bond-pads, electrically conductive support members projecting from corresponding bond-pads, and a cover on the support members and over the image sensor; and
a plurality of scribe lanes spacing apart the individual dies.

23. The microfeature workpiece of claim 22 wherein the individual electrically conductive support members comprise electrically conductive members projecting from corresponding bond-pads, and wherein the individual support members are electrically coupled to corresponding interconnects.

24. The microfeature workpiece of claim 22 wherein:
the cover is a single transparent plate across a plurality of dies and including a first side facing generally away from the corresponding image sensors and a second side facing generally toward the corresponding image sensors; and
the individual support members contact the second side of the single plate to space the plate apart from the corresponding image sensors by a desired distance.

25. The microfeature workpiece of claim 22, further comprising:
a plurality of stand-offs projecting from the cover, the individual stand-offs having a step and a sidewall defining a referencing element; and
a plurality of optics units, the individual optics units having a substrate and an optic member on the substrate, the substrate being seated with corresponding referencing elements to position individual optic members at a desired location relative to corresponding image sensors.

26. A microfeature workpiece, comprising:
a plurality of microelectronic dies, individual dies including (a) an image sensor, (b) an integrated circuit electrically coupled to the image sensor, (c) a plurality of bond-pads electrically coupled to the integrated circuit, and (d) electrically conductive interconnects extending through the die and in contact with corresponding bond-pads;
a plurality of discrete support members projecting from corresponding bond-pads;
a plurality of covers over corresponding image sensors, wherein individual covers are supported by the support members at a corresponding die; and
a plurality of scribe lanes spacing apart the individual dies.

27. The microfeature workpiece of claim 26, further comprising a plurality of optics units, wherein individual optics units are coupled to corresponding individual covers on each die, the individual optics units including an optic member positioned at a desired distance from the corresponding image sensors.

28. A plurality of microelectronic imagers, comprising:
a substrate;
a plurality of imaging units coupled to the substrate, the individual imaging units including (a) a microelectronic die with an image sensor, an integrated circuit electrically coupled to the image sensor, a plurality of bond-pads electrically coupled to the integrated circuit, and electrically conductive interconnects extending through the die and in contact with corresponding bond-pads, (b) a plurality of discrete support members projecting from corresponding bond-pads, and (c) a cover over the image sensor and coupled to at least one support member; and
a plurality of optics units coupled to corresponding imaging units, the individual optics units including an optic member positioned at a desired location relative to the corresponding image sensors.

29. The microelectronic imagers of claim 28 wherein the individual electrically conductive support members comprise electrically conductive members projecting from corresponding bond-pads, and wherein the individual support members are electrically coupled to corresponding interconnects.

30. The microelectronic imagers of claim 28 wherein:
the cover includes a single transparent plate across a plurality of dies and including a first side facing generally away from the corresponding image sensors and a second side facing generally toward the corresponding image sensors; and
the individual support members contact the second side of the single plate to space the plate apart from the corresponding image sensors by a desired distance.

31. The microelectronic imagers of claim 28, further comprising:
a first referencing element fixed to the cover of each individual die; and
individual optics units coupled to the first referencing element of each die, the individual optics units including an optic member and a second referencing element coupled to the optic member, the second referencing element being seated with the first referencing element to position the optic member at a desired location relative to the corresponding image sensors.

* * * * *